(12) United States Patent
Hannula et al.

(10) Patent No.: US 8,164,907 B2
(45) Date of Patent: Apr. 24, 2012

(54) COMMUNICATIONS DEVICE HAVING STRUCTURES FOR CONNECTING TO DETACHABLY INSTALLABLE POWER SUPPLY UNITS

(75) Inventors: Mikko Hannula, Espoo (FI); Petri Kohonen, Vantaa (FI)

(73) Assignee: Tellabs Oy, Espoo (FI)

( * ) Notice: Subject to any disclaimer, the term of this patent is extended or adjusted under 35 U.S.C. 154(b) by 569 days.

(21) Appl. No.: 12/364,700

(22) Filed: Feb. 3, 2009

(65) Prior Publication Data
US 2009/0195995 A1 Aug. 6, 2009

(30) Foreign Application Priority Data

Feb. 4, 2008 (FI) .................................... 20080084

(51) Int. Cl.
*H05K 7/00* (2006.01)
(52) U.S. Cl. ........ 361/728; 361/731; 361/735; 361/729; 361/730; 361/679.01; 174/50
(58) Field of Classification Search .......... 361/724–730, 361/752, 753, 795–797, 801–809; 174/50; 312/240
See application file for complete search history.

(56) References Cited

U.S. PATENT DOCUMENTS

| | | | |
|---|---|---|---|
| 4,931,907 A * | 6/1990 | Robinson et al. ............. | 361/727 |
| 5,398,161 A | 3/1995 | Roy | |
| 5,842,030 A | 11/1998 | Larabell et al. | |
| 6,008,995 A | 12/1999 | Pusateri et al. | |
| 6,285,159 B1 | 9/2001 | Ki et al. | |
| 6,297,962 B1 * | 10/2001 | Johnson et al. ............... | 361/726 |
| 6,309,237 B1 * | 10/2001 | Longueville ................... | 439/267 |
| 6,421,243 B1 * | 7/2002 | Ives et al. ...................... | 361/725 |
| 6,473,307 B2 * | 10/2002 | Mallette ......................... | 361/727 |
| 6,498,716 B1 * | 12/2002 | Salinas et al. ................. | 361/610 |
| 6,522,554 B1 | 2/2003 | Gomez et al. | |
| 6,535,390 B1 * | 3/2003 | Lo ................................. | 361/726 |
| 6,801,435 B1 * | 10/2004 | Su et al. ......................... | 361/747 |
| 6,986,679 B1 * | 1/2006 | Aronson et al. .............. | 439/374 |

(Continued)

FOREIGN PATENT DOCUMENTS

JP 2000-156577 6/2000

OTHER PUBLICATIONS

Finnish Search Report dated Aug. 18, 2008, from corresponding Finnish Application. EP Search Report in Corresponding Application No. EP 09 15 0494 Dated Jun. 8, 2010.

*Primary Examiner* — Angel R Estrada
*Assistant Examiner* — Dimary Lopez
(74) *Attorney, Agent, or Firm* — Young & Thompson

(57) ABSTRACT

A system includes a communications device and power supply units detachably installable thereon. On an outer surface of the communications device there is an aperture arranged to enable the insertion of different power supply units in different sections of the volume inside the communications device. The volume is continuous so that instead of separate power supply units it is possible to insert, through the aperture, in the volume a physically larger power supply unit which, when installed in the volume, extends into more than one section of the volume. The communications device can be flexibly equipped e.g. with power supply units functioning as backups for each other, each taking up part of the volume, or with a single power supply unit, larger than the above-mentioned, taking up the volume. Therefore the volume inside the communications device can be utilized in connection with power supply units of various types.

10 Claims, 6 Drawing Sheets

U.S. PATENT DOCUMENTS

| | | | |
|---|---|---|---|
| 7,214,088 B1 * | 5/2007 | Liang | 439/377 |
| 7,450,383 B1 * | 11/2008 | Li et al. | 361/695 |
| 7,456,807 B2 * | 11/2008 | Mizuno et al. | 345/60 |
| 2003/0072138 A1 | 4/2003 | Greenside et al. | |
| 2003/0112582 A1 | 6/2003 | Sanders et al. | |
| 2006/0246952 A1 | 11/2006 | Widmayer et al. | |
| 2007/0294433 A1 | 12/2007 | Leigh | |

* cited by examiner

COMMUNICATIONS DEVICE HAVING STRUCTURES FOR CONNECTING TO DETACHABLY INSTALLABLE POWER SUPPLY UNITS

FIELD OF THE INVENTION

The invention relates to a system comprising a communications device and power supply units detachably installable thereon. The invention also relates to a communications device having structures for connecting to detachably installable power supply units.

BACKGROUND OF THE INVENTION

Most communications devices such as routers, bridges, and switches need for their operation a stabilized DC voltage the temporal voltage fluctuation of which remains within predetermined limits. A stabilized DC voltage can be provided by DC-DC converters, AC-DC converters, or by batteries. In some cases a communications device may need an AC voltage meeting some predetermined requirements, which voltage can be provided by AC-AC converters and DC-AC converters. The power supply needs and requirements of a communications device are often specific to the installation site and even to the operational situation. The power demand of a communications device often depends on the number and transmission capacity of the communications links installed on the communications device, such as a router or switch, as well as on the communications protocols used. Additionally, the type of the electrical energy available can be different in different operating environments. In some operating environments there may be available a DC supply which gives a DC voltage from which a DC-DC converter produces the stabilized DC voltage needed by the communications device. In some other operating environments there may be available an AC supply which gives an AC voltage from which an AC-DC converter produces the stabilized DC voltage needed by the communications device.

In some prior-art solutions a communications device, such as a router or switch, is equipped with structures through which said communications device can be connected to one or more detachably installable power supply units. In such a case the power supply properties of the communications device can be flexibly altered by using power supply units suitable for different situations. Said power supply units are typically plug-in units which are plugged in the plug-in unit apertures of the communications device. If there exists a need to be able to connect the communications device to power supply units of many different types, the number of the different plug-in unit apertures as well as the space required for them often becomes a problem. For example, in communications devices installed on an equipment rack the surface area of the front panel is limited, which limits the number of plug-in unit apertures on said front panel.

SUMMARY

The invention pertains to a novel system comprising a communications device and power supply units detachably installed thereon. A system according to the invention comprises:
   a communications device,
   a first power supply unit detachably installable to the communications device,
   a second power supply unit detachably installable to the communications device, and
   a third power supply unit detachably installable to the communications device wherein the communication device has on its outer surface an aperture which is arranged so as to enable the insertion of the first power supply unit in a first section of a volume inside the communications device, said first power supply unit including electrical connectors arranged so as to connect with first electrical connectors of said communications device when said first power supply unit is inserted in the first section of said volume, and said aperture is arranged so as to enable the insertion of the second power supply unit in a second section of said volume, said second power supply unit including electrical connectors arranged so as to connect with second electrical connectors of said communications device when said second power supply unit is inserted in the second section of said volume, and said volume is continuous so that instead of said first and second power supply units the third power supply unit can be inserted through said aperture into said volume, the third power supply unit, when installed, extending into both said first section and said second section of said volume and the first electrical connectors of said communications device being capable of providing electrical connections with electrical connectors of the third power supply unit.

Since the volume reserved for the power supply units is continuous as described above, said communications device can be flexibly equipped e.g. with power supply units which function as back-ups for each other, each one taking up part of the volume, or with a single power supply unit, larger than the above-mentioned, which takes up said volume. Therefore the volume inside the communications device can be utilized in connection with power supply units of various types.

The invention pertains to a novel communications device. A communications device according to the invention comprises:
   on its outer surface an aperture arranged to enable the insertion of a first power supply unit in a first section of a volume inside the communications device and to enable the insertion of a second power supply unit in a second section of said volume,
   first electrical connectors arranged to connect with electrical connectors of said first power supply unit in response to the insertion of said first power supply unit in the first section of said volume, and
   second electrical connectors arranged to connect with electrical connectors of said second power supply unit in response to the insertion of said second power supply unit in the second section of said volume,
wherein said volume is continuous so that, instead of said first and second power supply units, a such third power supply unit, which extends into both said first and second sections of said volume when installed in said volume, can be inserted through said aperture into said volume, and the first electrical connectors of said communications device are capable of providing electrical connections to the third power supply unit.

The various embodiments of the invention are characterized by that which is specified in the dependent claims.

The embodiments of the invention have an advantage over the prior-art solution presented in this document, which advantage is that the one and the same volume inside a communications device can be utilized in connection with power supply units of many different types. Thus, for example, it is possible to decrease the number of plug-in unit apertures needed on the front panel of a communications device installable on an equipment rack because different power supply units can utilize one and the same plug-in unit aperture.

BRIEF DESCRIPTION OF THE FIGURES

Embodiments of the invention, presented by way of example, and their advantages will now be described in closer detail with reference to the accompanying Figures where.

DETAILED DESCRIPTION OF EMBODIMENTS OF INVENTION

Figure 1A:
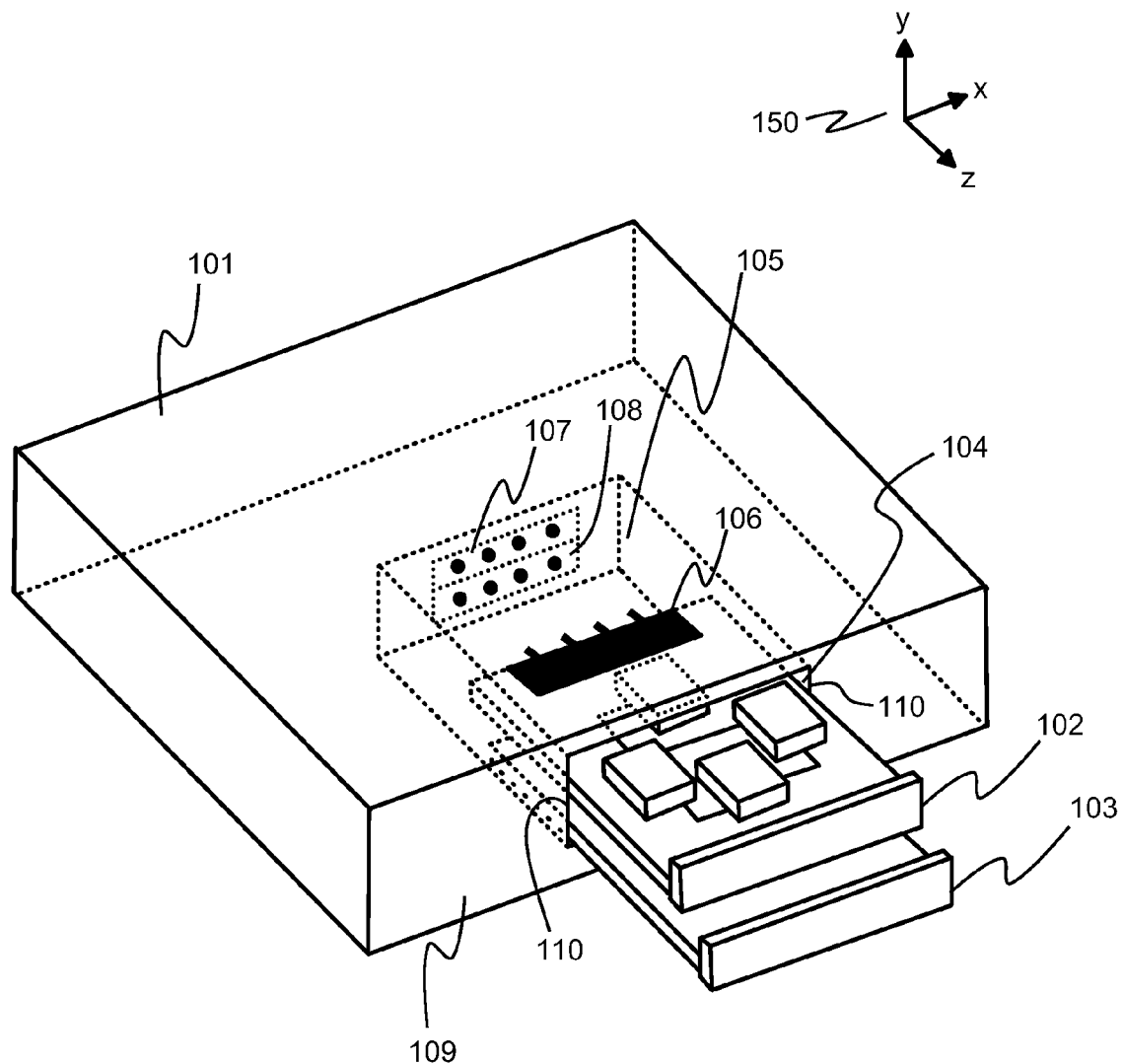
FIGS. 1a, 1b, and 1c illustrate a system according to the invention comprising a communications device and power supply units detachably installable thereon.

FIG. 1a illustrates a system according to an embodiment the invention comprising a communications device 101 and power supply units 102 and 103 detachably installable thereon. On an outer surface 109 of the communications device 101 there is an aperture 104 which is arranged so as to enable the insertion of a first power supply unit 102 in a first section of the volume 105 inside the communications device. The power supply unit 102 includes electrical connectors 106 which are arranged to connect with first electrical connectors 107 of the communications device when the power supply unit 102 is inserted in said first section of the volume 105. Said aperture 104 is arranged so as to enable the insertion of a second power supply unit 103 in a second section of the volume 105. The power supply unit 103 includes electrical connectors (not shown in FIG. 1a) which are arranged as to connect with second electrical connectors 108 of the communications device when the power supply unit 103 is inserted in said second section of the volume 105.

Figure 1B:
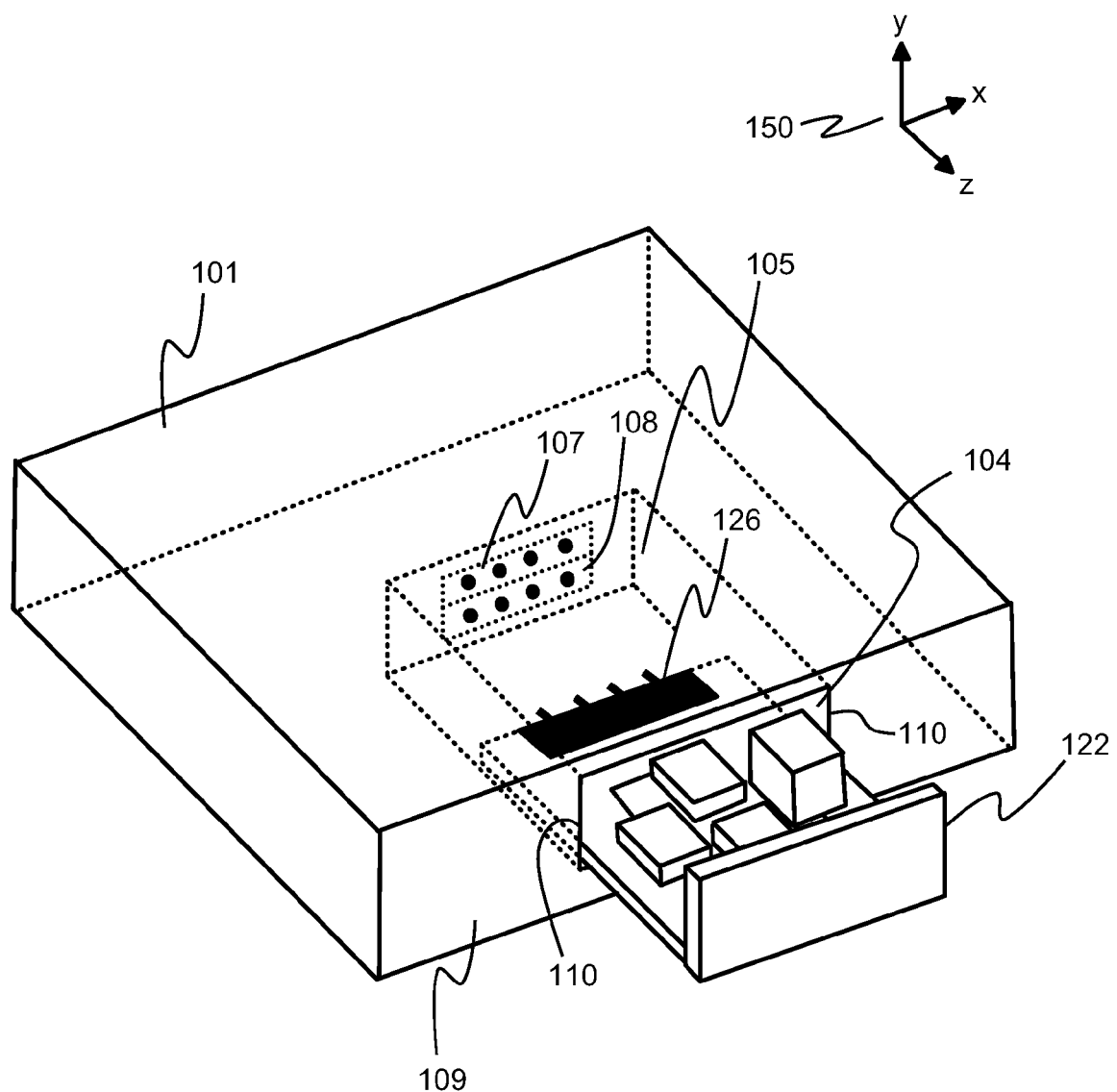

The volume 105 is continuous so that instead of power supply units 102 and 103 a third power supply unit can be inserted through the aperture 104 in the volume 105, which third power supply unit, when installed in the volume 105, is arranged to extend into said first section and said second section. FIG. 1b illustrates a system comprising a communications device 101 and a third power supply unit 122 which can be detachably installed thereon. In the y-direction of the coordinate system the power supply unit 122 is thicker than the power supply units 102 and 103 shown in FIG. 1a. The power supply unit 122 includes electrical connectors 126 which are arranged to connect with electrical connectors 108 of the communications device when the power supply unit 122 is inserted in the volume 105. Since the volume 105 reserved for the power supply units is continuous, the communications device 101 can be flexibly equipped with power supply units 102 and 103, each of which takes up part of the volume 105, or with a power supply unit 122, which is larger than the above-mentioned two units and alone takes up the volume 105. Therefore the volume 105 inside the communications device can be utilized in connection with power supply units 102 (103) and 122 which have different sizes.

The aperture 104 on an outer surface of the communications device 101 is substantially rectangular, and the spatial plane between said first section and second section is arranged to meet the shorter sides 110 of said aperture. Said spatial plane is parallel to the xz-plane of the coordinate system 150. In other words, power supply units 102 and 103 are installed one on top of the other in the y-direction of the coordinate system 150. Said spatial plane is not a physical entity but a geometrical concept used for explaining the matter in words.

In a system according to an embodiment of the invention comprising a communications device 101 and power supply units 102 and 103 detachably installable thereon, the power supply unit 102 is a DC-DC converter and the power supply unit 103 is a DC-DC converter.

In a system according to an embodiment of the invention comprising a communications device 101 and power supply units 102 and 103 detachably installable thereon, the power supply unit 102 is an AC-DC converter and the power supply unit 103 is a DC-DC converter.

In a system according to an embodiment of the invention comprising a communications device 101 and power supply units 102 and 103 detachably installable thereon, the power supply unit 102 is an AC-DC converter and the power supply unit 103 is an AC-DC converter.

In a system according to an embodiment of the invention comprising a communications device 101 and power supply units 102 and 103 detachably installable thereon, the power supply unit 102 is an AC-AC converter and the power supply unit 103 is an AC-AC converter.

In a system according to an embodiment of the invention comprising a communications device 101 and power supply units 102 and 103 detachably installable thereon, the power supply unit 102 is a DC-AC converter and the power supply unit 103 is an AC-AC converter.

In the system depicted in FIGS. 1a and 1b the electrical connectors of the power supply units 102, 103, and 122 are plug-in connectors. Said electrical connectors may also be metallized contact areas on a surface of a printed circuit board of the power supply unit, arranged to provide edge connectors at the edge of said printed circuit board.

The power supply units 102 and 103 may be arranged to operate simultaneously in parallel, for example, or in some other predetermined manner. For instance, one of the power supply units 102 and 103 may be arranged to operate as a primary power supply and the other one of the power supply units 102 and 103 may be arranged to operate as a back-up power supply taken into use when the primary power supply fails or when the power consumption of the communications device 101 exceeds the capacity of the primary power supply.

Figure 1C:
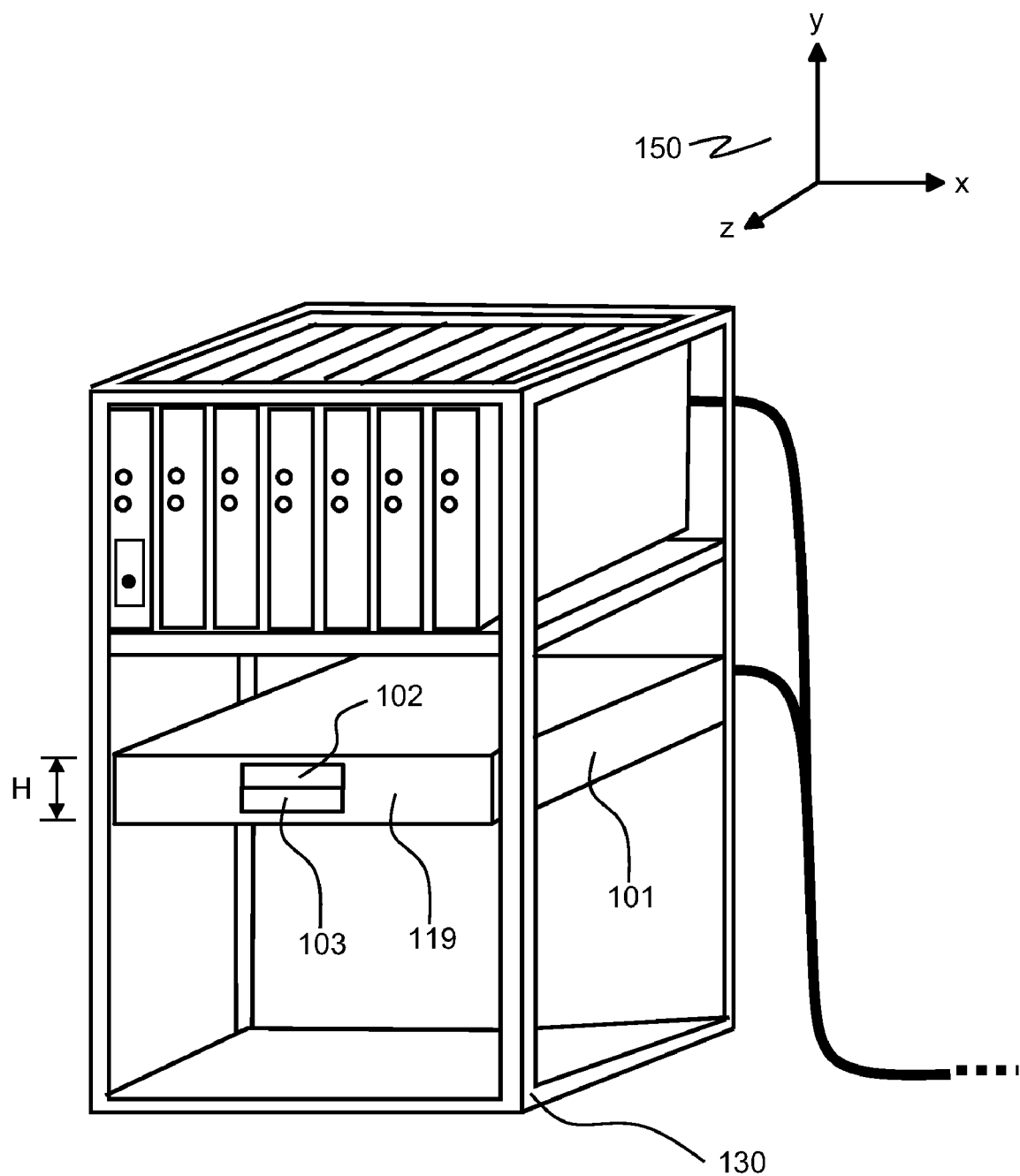

FIG. 1c shows a situation where the system comprising a communications device 101 and power supply units 102 and 103 detachably installable thereon is a unit to be installed on an equipment rack 130, substantially shaped like a rectangular prism. The installation aperture for power supply units is situated on the front panel of the communications device. Advantageously, the height of the communications device 101 is one height unit in accordance with standards EIA RS-310-D and IEC 60297-1, i.e. 44.45 mm. Advantageously the power supply units 102 and 103 are placed one on top of the other in order to save space in the direction of the width of the front panel 119 (x-direction of the coordinate system 150).

Figure 2A:
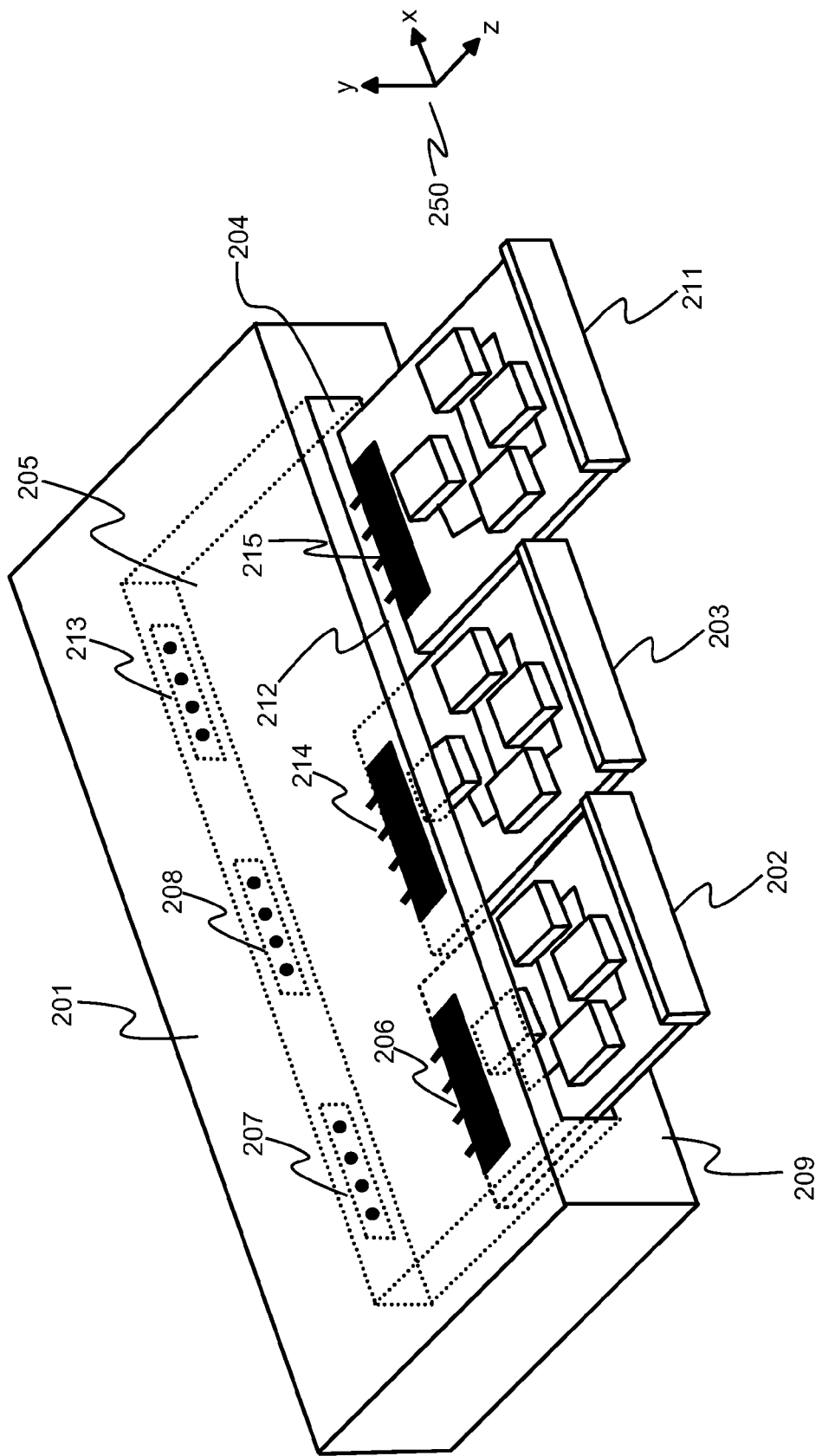
FIGS. 2a and 2b illustrate a system according to the invention comprising a communications device and power supply units detachably installable thereon.

FIG. 2a illustrates a system according to an embodiment the invention comprising a communications device 201 and power supply units 202, 203, and 211 detachably installable thereon. On an outer surface 209 of the communications device 201 there is an aperture 204 which is arranged so as to enable the insertion of a power supply unit 202 in a first section of the volume 205 inside the communications device, the insertion of a power supply unit in a second section of said volume 205, and the insertion of a power supply unit 211 in a third section of said volume 205. The power supply unit 202 includes electrical connectors 206 which are arranged to connect with first electrical connectors 207 of the communications device when the power supply unit 202 is inserted in said first section of the volume 205. The power supply unit 203 includes electrical connectors 214 which are arranged to connect with second electrical connectors 208 of the communications device when the power supply unit 203 is inserted in said second section of the volume 205. The power supply unit 211 includes electrical connectors 215 which are arranged to connect with third electrical connectors 213 of the communications device when the power supply unit 211 is inserted in said third section of the volume 205.

Figure 2B:
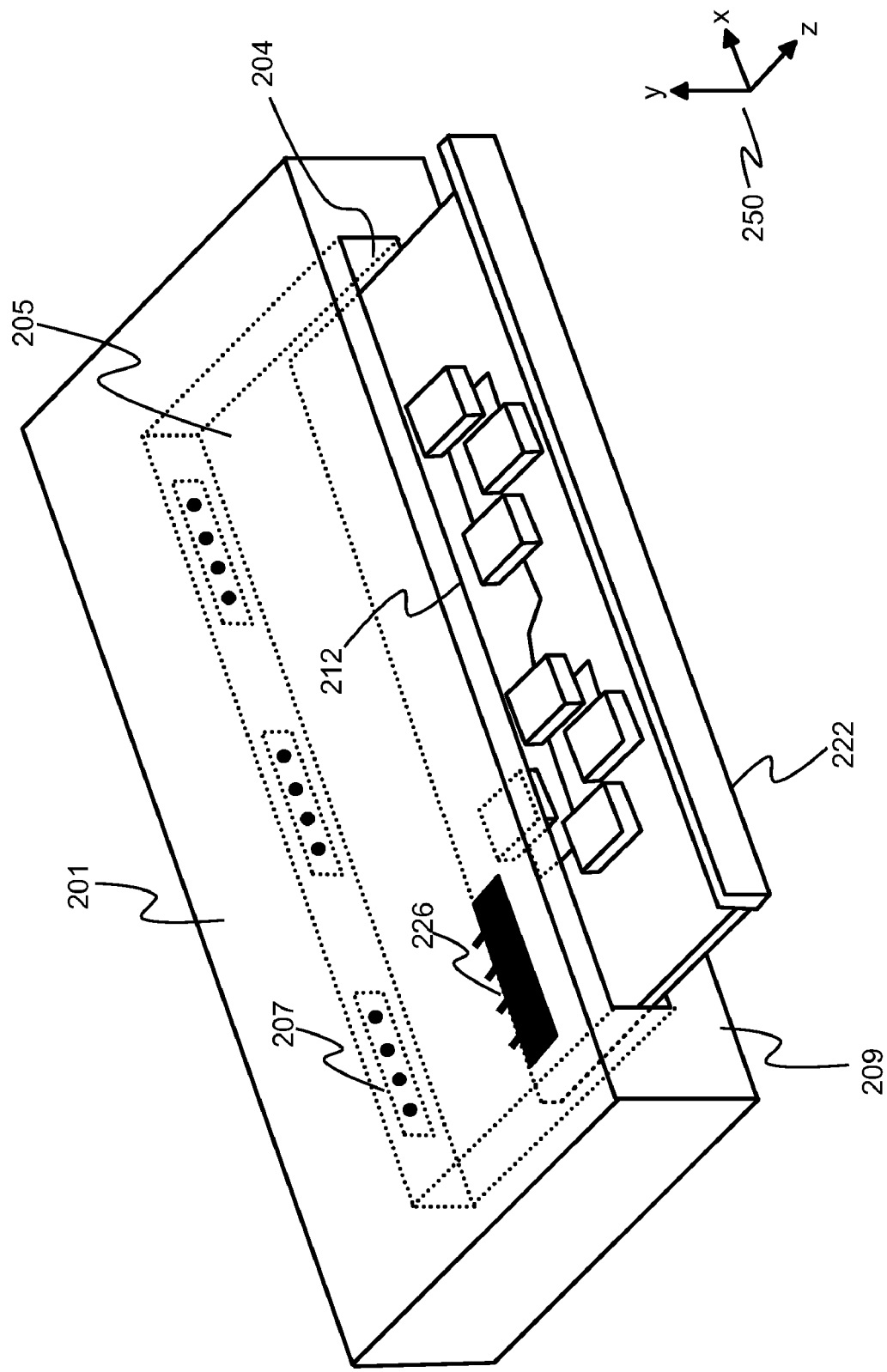

The volume 205 is continuous so that instead of power supply units 202, 203, and 211 a power supply unit can be inserted through the aperture 204 in the volume 205, which power supply unit, when installed in the volume 205, is arranged to extend into said first section, said second section, and said third section. FIG. 2b illustrates a system comprising a communications device 201 and power supply unit 222 which can be detachably installed thereon. In the x-direction of the coordinate system 250 the power supply unit 222 is wider than the power supply units 202, 203, and 211 shown in FIG. 2a. The power supply unit 222 includes electrical connectors 226 which are arranged to connect with electrical connectors 207 of the communications device when the power supply unit 222 is inserted in the volume 205. Since the volume 205 reserved for the power supply units is continuous, the communications device 201 can be flexibly equipped with power supply units 202, 203, and 211, each of which takes up part of the volume 205, or with a single power supply unit 222, which is larger than the above-mentioned two units and alone takes up the volume 205. Therefore the volume 205 inside the communications device can be utilized in connection with power supply units 202 (203, 211) and 222 which have sizes different from each other. Naturally it is also possible to install in volume 205 a power supply unit which, when installed in volume 205, is arranged to extend e.g. only into said first section and said second section or only into second section and said third section.

The aperture 204 on an outer surface of the communications device 201 is substantially rectangular, and the spatial plane between said first section and second section is arranged to meet the longer sides 212 of said aperture. Said spatial plane is parallel to the yz-plane of the coordinate system 250. The same applies to the spatial plane between said second section and third section of the volume 205. In other words, power supply units 202, 203, and 211 are installed besides one another in the x-direction of the coordinate system 250. Said spatial planes are not physical entities but geometrical concepts used for explaining the matter in words.

Each of the power supply units 202, 203, 211, 222 is at least one of the following: AC-DC converter, DC-DC converter, AC-AC converter, and DC-AC converter.

Figure 3:
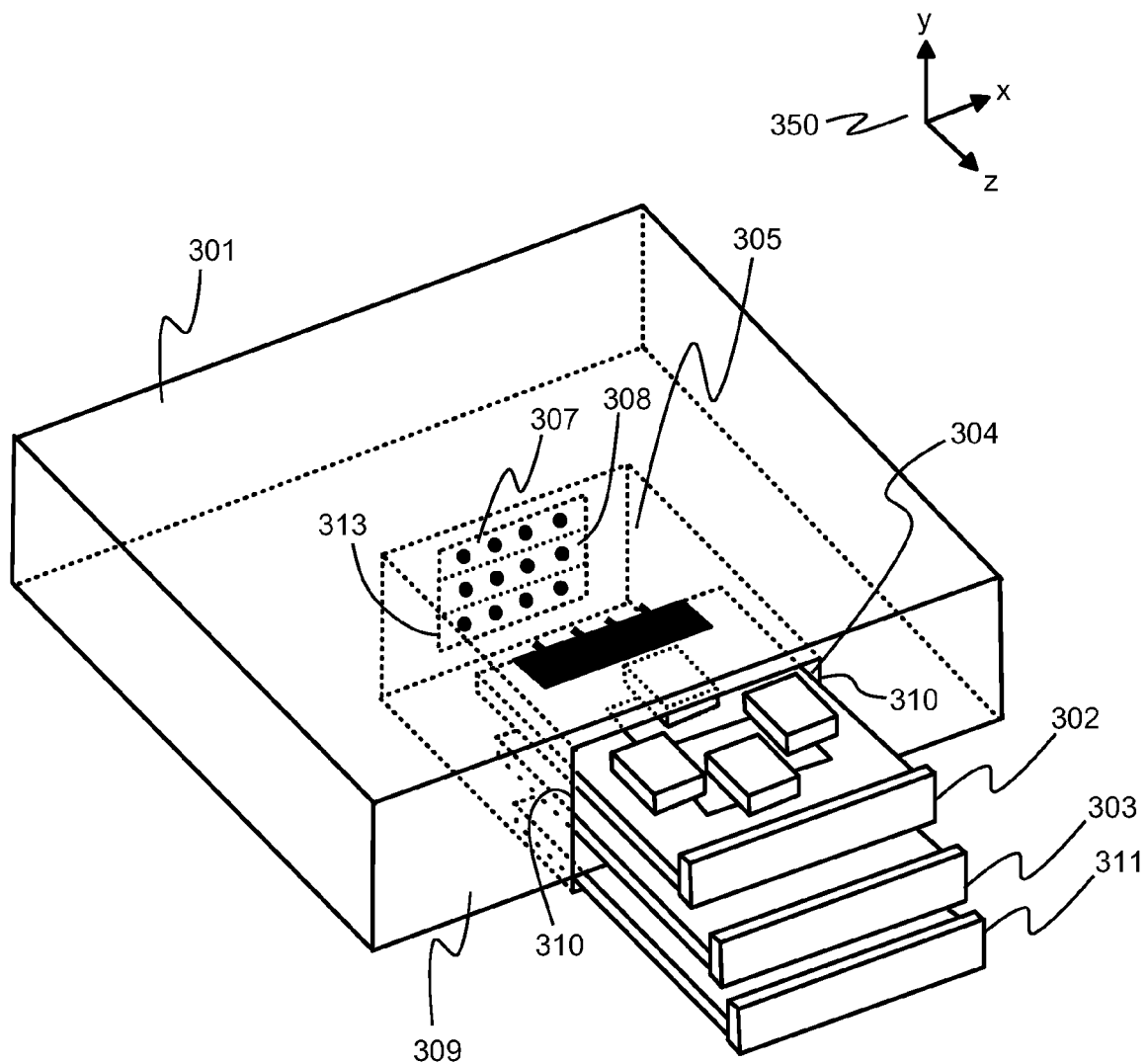
FIG. 3 illustrates a communications device according to an embodiment of the invention.

FIG. 3 illustrates a communications device 301 according to an embodiment of the invention. On an outer surface 309 of the communications device there is an aperture 304 which is arranged so as to enable the insertion of a first power supply unit 302 in a first section of the volume 305 inside the communications device, the insertion of a second power supply unit 303 in a second section of said volume 305, and the insertion of a power supply unit 311 in a third section of said volume 305. The communications device includes first electrical connectors 307 arranged to connect with electrical connectors of power supply unit 302 in response to the insertion of the power supply unit 302 in the first section of said volume 305. The communications device includes second electrical connectors 308 arranged to connect with electrical connectors of power supply unit 303 in response to the insertion of the power supply unit 303 in the second section of said volume 305. The communications device includes third electrical connectors 313 arranged to connect with electrical connectors of power supply unit 311 in response to the insertion of the power supply unit 311 in the third section of said volume 305. The volume 305 is continuous so that instead of power supply units 302, 303, and 311 a power supply unit can be inserted through the aperture 304 in the volume 305, which power supply unit, when installed in the volume 305, is arranged to extend into said first section, said second section, and said third section, or only into said first section and said third section, or only into said second section and said third section.

The aperture 304 on an outer surface of the communications device 301 is substantially rectangular, and the spatial plane between said first section and second section is arranged to meet the shorter sides 310 of said aperture. Said spatial plane is parallel to the xz-plane of the coordinate system 350. The same applies to the spatial plane between said second section and third section of the volume 305. In other words, power supply units 302, 303, and 331 are installed one on top of the other in the y-direction of the coordinate system 350. Said spatial planes are not physical entities but geometrical concepts used for explaining the matter in words.

In a communications device according to another embodiment of the invention the spatial plane between two different sections in the continuous volume reserved for power supply units is arranged to meet the longer sides of said aperture. Said communications device may be a communications device 201 shown in FIGS. 2a and 2b, for example.

A communications device according to an embodiment of the invention is a unit installable on an equipment rack, substantially shaped like a rectangular prism, and the aperture which exists for the installation of power supply units is situated on the front panel of the communications device.

A communications device according to an embodiment of the invention is at least one of the following: an IP (Internet Protocol) router, ATM (Asynchronous Transfer Mode) switch, Ethernet switch, and MPLS (Multi Protocol Label Switching) switch.

As is obvious to a person skilled in the art, the invention and its embodiments are not limited to the exemplary embodiments depicted above, but the invention and its embodiments can be modified within the scope of the independent claim. Expressions used in the claims describing the existence of characteristic features, such as "power supply unit includes electrical connectors" are non-exclusive such that a mention of a characteristic feature shall not exclude the existence of other characteristic features not mentioned in the independent or dependent claims.

What is claimed is:

1. A system, comprising:
   a communications device comprising a volume and an outer surface;
   a first power supply unit detachably installable to the communications device;
   a second power supply unit detachably installable to the communications device; and
   a third power supply unit detachably installable to the communications device,
   wherein the communications device has on the outer surface an aperture configured to enable insertion of the first power supply unit into a first section of the volume inside the communications device,
   said first power supply unit including electrical connectors configured to connect with first electrical connectors of said communications device when said first power supply unit is inserted in the first section of said volume, and wherein said aperture is also configured to enable insertion of the second power supply unit into a second section of said volume, said second power supply unit including electrical connectors configured to connect with second electrical connectors of said communications device when said second power supply unit is inserted in the second section of said volume, and said volume being continuous such that, in place of said first and second power supply units, the third power supply unit can be inserted through said aperture into said volume, the third power supply unit, when installed, extending into both said first section and said second section of said volume, and the first electrical connectors of said communications device configured to provide electrical connections with electrical connectors of the third power supply unit.

2. The system according to claim 1, wherein said aperture is substantially rectangular, and a spatial plane between said first section and second section of said volume meets the shorter sides of said aperture.

3. The system according to claim 1, wherein said aperture is substantially rectangular, and a spatial plane between said first section and second section of said volume meets the longer sides of said aperture.

4. The system according to claim 1,
wherein said first power supply unit is one of the group consisting of: an AC-DC converter, a DC-DC converter, an AC-AC converter, and a DC-AC converter, and
wherein said second power supply unit is one of the group consisting of: an AC-DC converter, a DC-DC converter, an AC-AC converter, and a DC-AC converter.

5. The system according to claim 1, wherein said communications device is a unit installable on an equipment rack, said unit being substantially shaped like a rectangular prism, and said aperture being situated one a front panel of the communications device.

6. A communications device, comprising:
an internal volume and an outer surface;
an aperture on said outer surface and configured to enable insertion of a first power supply unit into a first section of the volume inside the communications device and to enable the insertion of a second power supply unit into a second section of said volume;
first electrical connectors arranged to connect with electrical connectors of said first power supply unit in response to the insertion of said first power supply unit in the first section of said volume, and
second electrical connectors arranged to connect with electrical connectors of said second power supply unit in response to the insertion of said second power supply unit in the second section of said volume,
wherein said volume is continuous so that, in place of said first and second power supply units, a third power supply unit, extending into both of said first and second sections of said volume when installed in said volume, is insertable through said aperture into said volume, and the first electrical connectors of said communications device are configured to provide electrical connections with electrical connectors of the third power supply unit.

7. The communications device according to claim 6, wherein said aperture is substantially rectangular, and a spatial plane between said first section and second section of said volume meets the shorter sides of said aperture.

8. The communications device according to claim 6, wherein said aperture is substantially rectangular, and a spatial plane between said first section and second section of said volume meets the longer sides of said aperture.

9. The communications device according to claim 6, wherein the communications device is a unit installable on an equipment rack, said unit being substantially shaped like a rectangular prism, and said aperture being situated on the front panel of the communications device.

10. The communications device according to claim 6, wherein the communications device is at least one of the group consisting of: an IP (Internet Protocol) router, an ATM (Asynchronous Transfer Mode) switch, an Ethernet switch, and an MPLS (Multi Protocol Label Switching) switch.

* * * * *